(12) United States Patent
Harber et al.

(10) Patent No.: US 11,031,874 B2
(45) Date of Patent: Jun. 8, 2021

(54) ELECTRICAL POWER CONVERSION SYSTEM

(71) Applicant: SIEMENS AKTIENGESELLSCHAFT, Munich (DE)

(72) Inventors: Matthew Harber, Carina (AU); David Russell Murray, Lota (AU)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/583,547

(22) Filed: Sep. 26, 2019

(65) Prior Publication Data

US 2020/0099308 A1   Mar. 26, 2020

(30) Foreign Application Priority Data

Sep. 26, 2018   (EP) .................................... 18196756

(51) Int. Cl.
| | | |
|---|---|---|
| *H02M 3/335* | (2006.01) | |
| *H02M 1/00* | (2006.01) | |
| *H05K 1/14* | (2006.01) | |
| *H05K 1/16* | (2006.01) | |
| *H05K 1/18* | (2006.01) | |

(52) U.S. Cl.
CPC ......... *H02M 3/33553* (2013.01); *H02M 1/00* (2013.01); *H05K 1/144* (2013.01); *H05K 1/167* (2013.01); *H05K 1/181* (2013.01); *H02M 2001/0009* (2013.01); *H05K 2201/10015* (2013.01); *H05K 2201/10022* (2013.01); *H05K 2201/10522* (2013.01)

(58) Field of Classification Search
CPC ....................... H02M 1/00; H02M 2001/0009; H05K 1/144; H05K 1/167; H05K 1/181; H05K 2201/10015; H05K 2201/10022; H05K 2201/10522
See application file for complete search history.

(56) References Cited

U.S. PATENT DOCUMENTS

| | | | | |
|---|---|---|---|---|
| 4,117,527 A | * | 9/1978 | Demarest ................. | H02H 6/00 340/598 |
| 4,131,939 A | * | 12/1978 | Day ........................ | H02M 7/06 307/11 |
| 4,353,112 A | * | 10/1982 | Rietveld ............. | H02M 3/3376 363/16 |
| 4,408,269 A | * | 10/1983 | Nowaczyk ............ | H02M 7/062 327/494 |
| 5,552,978 A | | 9/1996 | Moncorge | |
| (Continued) | | | | |

FOREIGN PATENT DOCUMENTS

DE   3714945 A1   11/1987

*Primary Examiner* — Yusef A Ahmed
(74) *Attorney, Agent, or Firm* — Laurence Greenberg; Werner Stemer; Ralph Locher (57) ABSTRACT

An improved electrical power conversion system converts a high voltage (HV) from a HV electrical power supply to a low voltage. The electrical power conversion system includes at least one power converter and at least one RC network connected in series. The RC network includes a plurality of resistive components and a plurality of capacitive components electrically connected in series. The at least one RC network and at least one power converter are arranged to be connected across a line potential of the HV electrical power supply.

14 Claims, 5 Drawing Sheets

(56) References Cited

U.S. PATENT DOCUMENTS

| | | | | |
|---|---|---|---|---|
| 5,936,357 A * | 8/1999 | Crouse | H05B 41/28 | 315/247 |
| 6,011,705 A * | 1/2000 | Duca | H02M 1/14 | 363/39 |
| 6,061,259 A * | 5/2000 | DeMichele | H02M 7/2176 | 323/285 |
| 6,188,588 B1 * | 2/2001 | Hemena | H02M 3/33507 | 363/21.12 |
| 6,633,154 B1 * | 10/2003 | Duff, Jr. | H01G 9/155 | 320/166 |
| 7,304,872 B1 * | 12/2007 | Yakymyshyn | H02M 5/06 | 307/140 |
| 2002/0191359 A1 * | 12/2002 | Chen | H02H 9/001 | 361/58 |
| 2003/0035311 A1 * | 2/2003 | Phadke | H02H 9/001 | 363/89 |
| 2008/0054866 A1 * | 3/2008 | Korsunsky | H02M 1/08 | 323/272 |
| 2014/0078622 A1 * | 3/2014 | Crane | H02H 3/087 | 361/8 |
| 2014/0098584 A1 * | 4/2014 | Gucyski | H02M 1/4208 | 363/126 |
| 2014/0177304 A1 * | 6/2014 | Sadwick | H02M 7/06 | 363/126 |
| 2014/0217998 A1 * | 8/2014 | Krueger | G05F 1/46 | 323/273 |
| 2014/0368035 A1 * | 12/2014 | Lofthouse | H02M 3/155 | 307/31 |
| 2016/0081147 A1 * | 3/2016 | Guang | F21K 9/278 | 315/123 |
| 2017/0006675 A1 * | 1/2017 | van den Broeke | H05B 45/14 | |
| 2017/0202087 A1 * | 7/2017 | Murray | H02M 7/06 | |
| 2018/0059190 A1 * | 3/2018 | Verbrugge | G01R 31/396 | |
| 2018/0115237 A1 * | 4/2018 | Morin | H02M 3/156 | |
| 2019/0357334 A1 * | 11/2019 | Hsia | H02J 9/065 | |
| 2020/0021184 A1 * | 1/2020 | Frampton | H02M 7/48 | |
| 2020/0153286 A1 * | 5/2020 | Mao | H02J 50/80 | |

\* cited by examiner

ELECTRICAL POWER CONVERSION SYSTEM

CROSS-REFERENCE TO RELATED APPLICATION

This application claims the priority, under 35 U.S.C. § 119, of European application EP 18196756, filed Sep. 26, 2018; the prior application is herewith incorporated by reference in its entirety.

BACKGROUND OF THE INVENTION

Field of the Invention

The present invention relates generally to an electrical power conversion system.

In various electrical networks there are increasing opportunities to use load electronic systems to provide improved protection, automation and communication products for use with those electrical networks. It therefore becomes necessary to provide a suitable power supply for use by the load electronic systems.

In locations where a low voltage (LV) power supply is not available, or in applications where the electronic systems are preferably floated at high voltage (HV) line potential, there may be prohibitive cost or space barriers in providing a power supply drawing its power from the HV line itself.

It will be understood that the term high voltage (HV) relates to AC voltages between 1 kV and 38 kV or between 1 kV and 52.5 kV. As an alternative, HV may relate to AC voltages between 5 kV and 38 kV. As a further alternative, HV may relate to AC voltages between 5 kV and 35 kV. As a further alternative, HV may relate to AC voltages between 1 kV and 35 kV. As yet a further alternative, it will be understood that the term HV may relate to AC voltages above 35 kV. As yet a further alternative, HV may relate to AC voltages above 38 kV or above 52.5 kV.

The problem of providing power to load electronic systems is becoming more acute as the applications for load electronic systems expand.

As power requirements for load electronic systems are diminishing each year with the introduction of new semiconductor and communications technologies, an opportunity is provided for the provision of limited power from the line voltage of HV power supplies at low cost.

Voltage power supplies utilizing HV electrical networks have to overcome several problems.

One such problem is that HV electrical networks need to withstand high electrical stresses due to the high system voltage being applied. These therefore require appropriate insulation systems with due regard to surface tracking, material breakdown, partial discharge, and so on. There are standard production tests that may be used to monitor electrical stress, such as, for example, power frequency (PF) tests and partial discharge tests.

Further, these electrical networks need to withstand high over-voltage impulses which may occur in electrical networks. These are usually caused by lightning or connected switching devices and can be 100 kV or more on electrical networks.

There are standard design tests that may be used to monitor for this condition, such as, for example, lightning impulse tests etc.

Also, the consequences of insulation failure are usually catastrophic and can result in explosions because of the high voltages and high energies involved. This can lead to a significant design effort in order to limit the consequences of failure. Also, this can result in over-design, which can further result in increased product cost.

Overcoming these problems can therefore lead to large, heavy and expensive solutions with high installation costs to the utility.

It is known to derive power from the line connection on a HV network to operate remote equipment, such as a recloser for example, where the power is obtained via a wound voltage transformer (VT). This has been considered necessary for the high power requirement of the controllers (approximately 20-50 W) which operate at ground potential.

However, design and construction of a wound VT is complex and costly. Also, reducing the power requirements for the wound VT does not reduce the cost in proportion. For example, a 200 mW VT is not one thousandth of the cost of a 200 W VT.

A wound VT is a well-established solution that comes at high installation and purchase installation cost. Moreover, for certain products, such as the Fusesaver® product offered by Siemens Aktiengesellschaft, or indeed other equipment running at line potential, the requirement would be for multiple VT's or a special purpose design with multiple isolated secondary windings in order to supply the electronics that are at line potential on each phase This therefore increases costs further.

Although the wound VT may be a good solution for applications requiring several watts of power, it is not considered a good solution for use with applications requiring less than one watt of power. These may include, for example, applications such as capacitor bank switches and reclosers operating at line potential, as well as fault indicators and line quality monitors etc.

High voltage ceramic capacitors have been used previously for low power controllers. According to this method, the HV line is fed through the capacitor to a grounded power transformer (VT) with a primary voltage that is much lower than the line voltage. In theory, the cost of lower voltage transformer is much lower than that of a high voltage transformer.

Special purpose capacitors have also been developed for high voltage electrical systems for this purpose. Although they are cheaper than a wound VT, they still require insulation systems to be engineered. Further, these special purpose capacitors may suffer from significant problems. For example, these special purpose capacitors may not withstand lightning impulse voltages of the required magnitude. Further, on impulse they may offer low impedance to the wave front and hence apply a high or very high voltage surge to the transformer which means the transformer design is complex and/or additional protection components must be incorporated.

These fundamental problems make use of these special purpose capacitors in conjunction with a transformer very problematic and, accordingly, they are not considered a viable solution to the problem. It may also be possible to use an inductor in series with a transformer to limit the current at line voltage. This has the advantage of limiting the voltage applied to the transformer during impulse, as the impulse voltage is withstood across the inductor. However, the design and construction of the inductor is almost as complex as the design for a VT, where they have to solve the problem of withstanding full impulse voltage across a wound inductor.

Therefore, series inductors are not considered a viable solution to the problem.

Another possible solution would be to use a resistor in series with the transformer as this is much easier to design from the perspective of withstanding a high impulse voltage. However, the resistor power dissipation will usually be high at normal line voltages. For example, for a 22 kV line with a 1 mA resistor current, a dissipation of 13 W is required which can result in significant heating.

When performing a PF test power dissipation may increase further. For example, 13 W power dissipation may become 200 W during a 50 kV PF test, which may be impossible to manage. Furthermore, if a higher primary current is required (e.g. 2 mA) then these power dissipations may double again.

Therefore, a series resistor in conjunction with a transformer is not considered a viable solution to the problem.

Furthermore, U.S. Pat. No. 7,304,872 discloses the use of an R-C chain to create a leakage current suitable to act as a LV power supply. In case of a sufficient voltage is applied and a partial discharge occurs, a charge can be trapped in the capacitors. If the partial discharge persists, this trapped charge continues to build up and applies a DC voltage to the capacitors until their voltage limit is reached and the capacitors fail.

SUMMARY OF THE INVENTION

It is accordingly an object of the invention to provide a power conversion system which overcomes the above-mentioned and other disadvantages of the heretofore-known devices and methods of this general type and which provides a low cost, compact solution which may be built into equipment with the consequence of little or no installation cost to the utility.

With the foregoing and other objects in view there is provided, in accordance with the invention, an electrical power conversion system for converting a high voltage (HV) from an HV electrical power supply to a low voltage, the electrical power conversion system comprising:

a power converter; and an RC network connected in series with said power converter;

said RC network including a plurality of resistive components and a plurality of capacitive components electrically connected in series; and said RC network further including high resistance drop off elements connected in parallel with said capacitive components;

wherein said RC network and said power converter are connected across a line potential of the HV electrical power supply.

In other words, an embodiment is directed to an electrical power conversion system for converting a high voltage (HV) from a HV electrical power supply to a low voltage, wherein the electrical power conversion system comprises at least one power converter, and at least one RC network with a plurality of resistive components and a plurality of capacitive components electrically connected in series, wherein the at least one RC network is in series connection with the at least one power converter, and the at least one RC network and at least one power converter are arranged to be connected across a line potential of the HV electrical power supply. Further, high resistance drop off elements are connected in parallel with the capacitive components of the RC network. Such high resistance drop off elements avoid potential failures of capacitive components of the RC network due to trapped charges building up in the capacitive components.

In accordance with an added feature of the invention, each of the capacitive components of the RC network has a high resistance drop off element connected in parallel.

In a preferred implementation of the invention, the high resistance drop off elements are high value resistors.

Also preferred is that the high value resistors are designed to allow a trapped charge in the capacitive components to drop off the capacitive components. This especially avoids, that trapped charges in capacitive components continue to build up and apply a DC voltage to the capacitive components, especially capacitors, until their voltage limit is reached and the capacitive components, especially capacitors, fail.

It further preferred that the high resistance drop off elements are realized by a conductive coating on a printed circuit board holding at least the capacitive components. Such a setup allows a highly integrated, compact circuit.

Also preferred is that the power converter comprises a switched-mode power supply.

It is preferred that the resistive components are surface mounted resistive components and the capacitive components are surface mounted capacitive components, and the surface mounted resistive components and the surface mounted capacitive components are mounted on one or more electronic circuit boards forming the RC network on the one or more electronic circuit boards.

Further preferred is that the surface mounted resistive components and the surface mounted capacitive components are mounted on a plurality of electronic circuit boards forming a plurality of RC networks with one RC network on each electronic circuit board, and the plurality of electronic circuit boards are stacked and electrically interconnected forming a stacked RC network.

It is further preferred that the power converter is mounted on a further electronic circuit board, and the further electronic circuit board forms part of the plurality of electronic circuit boards that are stacked.

Also preferred is that the power conversion system further comprises one or more insulated circuit board receptacles arranged to support the one or more electronic circuit boards.

Further preferred is that the power conversion system further comprises a plurality of the insulated circuit board receptacles, each arranged to support one of a plurality of the electrically interconnected electronic circuit boards in a stacked configuration.

It is further preferred that the power conversion system further comprises a voltage sense module adapted to measure a current flowing through the RC network and convert the current to a sensor voltage value.

Furthermore, it is preferred that the power conversion system further comprises a voltage loss correction module, wherein the voltage loss correction module is adapted to correct the sensor voltage value based on voltage losses caused by the power converter.

Also preferred is that the at least one RC network and at least one power converter are arranged to be connected between a line connection of the HV electrical power supply and a ground connection of the HV electrical supply.

Preferred is that the at least one RC network and at least one power converter are arranged to be connected between a first line connection of the HV electrical power supply and a second line connection of the HV electrical supply.

Other features which are considered as characteristic for the invention are set forth in the appended claims.

Although the invention is illustrated and described herein as embodied in an electrical power conversion system it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Where reference is made in any one or more of the accompanying drawings to steps and/or features, which have the same reference numerals, those steps and/or features have for the purposes of this description the same function(s) or operation(s), unless the contrary intention appears.

It will be understood that the power conversion system described herein may be suitable for a number of different types of applications and products, such as any situation requiring low electrical power at low voltage where there is not a pre-existing low voltage power supply but there is a pre-existing HV power supply. The power conversion system may be used with capacitor bank switches, fault indicators, intelligent circuit breakers, reclosers etc. It may also be used in power switching systems, such as HV switching devices, which are particularly suited for receiving power from the power conversion system as herein described. Other examples of suitable systems include remote monitoring or control or protection equipment which fit the above situation.

Figure 1:
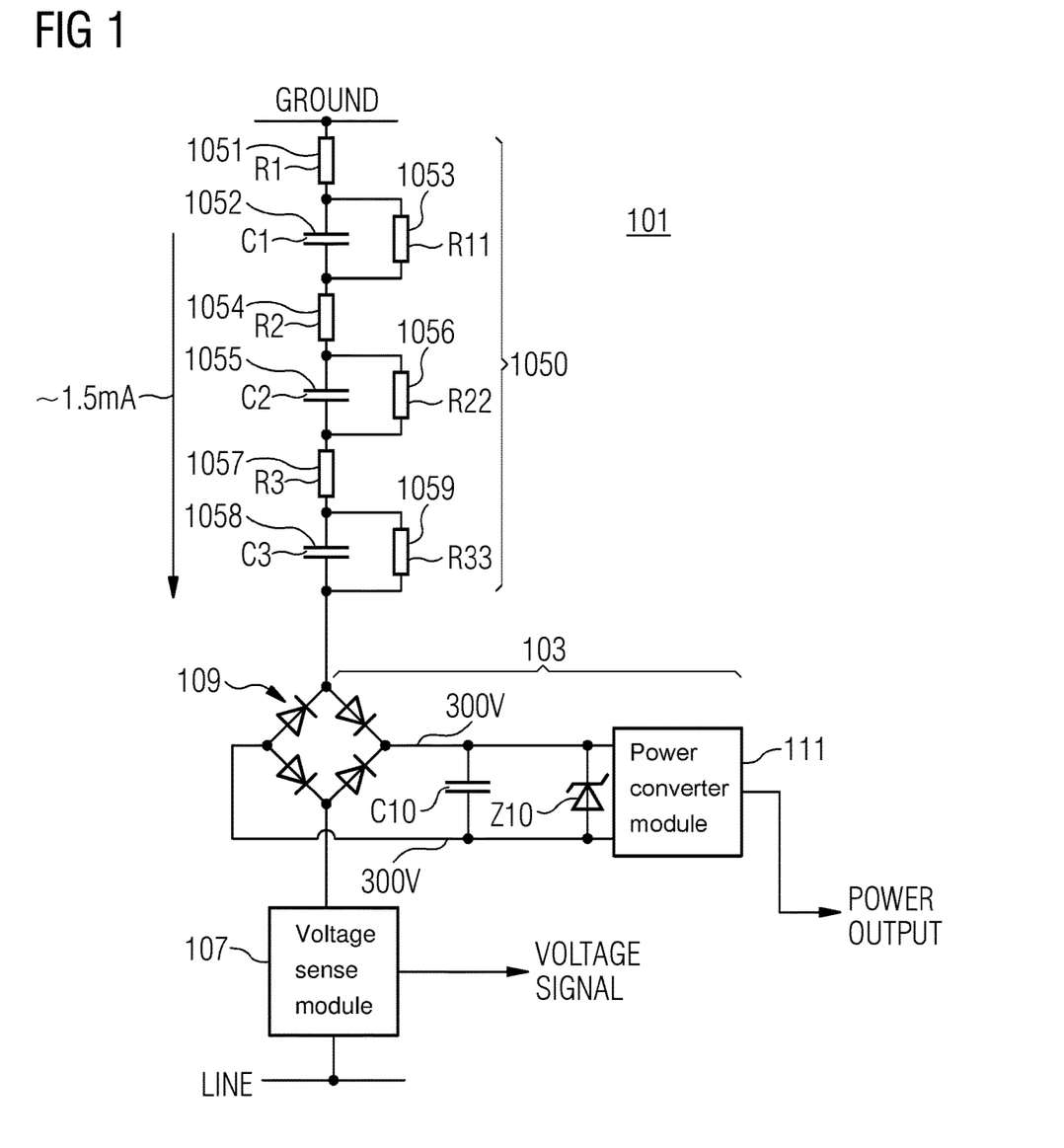
FIG. 1 is a schematic diagram of an electrical power conversion system according to the present invention.

Referring now to the figures of the drawing in detail and first, particularly, to FIG. 1 thereof, there is shown a schematic diagram of an electrical power conversion system 101 for converting a high voltage from a high voltage (HV) electrical power supply to a low voltage. It will be understood that the term low voltage relates to a power source at a suitable voltage for the application, so the application does not have to solve insulation and power conversion problems. Typically, the application will be operating electronic systems at extra low voltage, commonly 3-30 VDC. However other applications might require, for example, 230 VAC which will require a different design of power converter. Other elements of the power conversion system would not necessarily change, including the RC network as described herein.

It will be understood that the term HV relates to AC voltages between 1 kV and 38 kV or between 1 kV and 52.5 kV. As an alternative, HV may relate to AC voltages between 5 kV and 38 kV. As a further alternative, HV may relate to AC voltages between 5 kV and 35 kV. As a further alternative, HV may relate to AC voltages between 1 kV and 35 kV. As yet a further alternative, it will be understood that the term HV may relate to AC voltages above 35 kV. As yet a further alternative, HV may relate to AC voltages above 38 kV or above 52.5 kV.

The electrical power conversion system described herein has a power converter 103 for converting the high voltage from the HV system to provide a low voltage electrical power supply, and at least one RC network 1050 connected in series with the power converter to provide a current source.

The RC network 1050 has a plurality of (i.e. two or more) resistive components 1051, 1054, 1057 and a plurality of (i.e. two or more) capacitive components 1052, 1055, 1058, where the resistive components 1051, 1054, 1057 and capacitive components 1052, 1055, 1058 are electrically connected in series. Additionally, high resistance drop off elements 1053, 1056, 1059 are connected in parallel to each of the two or more capacitive components 1052, 1055, 1058 of the RC network 1050.

According to the exemplary implementation shown in FIG. 1, there are three resistive components (resistors) 1051, 1054, 1057 and three capacitive components (capacitors) 1052, 1055, 1058, where the resistors 1051, 1054, 1057 and capacitors 1052, 1055, 1058 are connected in a series chain and are alternated. That is, no two resistors 1051, 1054, 1057 are directly connected together and no two capacitors 1052, 1055, 1058 are directly connected together. This arrangement distributes the electric field along the length of the chain and so enables the insulation system to be managed much more easily.

It will be understood that, as an alternative, two or more capacitors 1052, 1055, 1058 may be directly connected together, and two or more resistors 1051, 1054, 1057 may be directly connected together. For example, all resistors 1051, 1054, 1057 may be connected together in series at one end of the RC network 1050 and all capacitors 1052, 1055, 1058 may be connected in series at the other end of the RC network 1050. Further, according to this example, resistor R1 1051 is connected between a ground connection and capacitor C1 1052, C1 1052 is connected between R1 1051 and resistor R2 1054, R2 1054 is connected between C1 1052 and capacitor C2 1055, C2 1055 is connected between R2 1054 and resistor R3 1057, R3 1057 is connected between C2 1055 and capacitor C3 1058, and C3 1058 is connected between R3 1057 and the power converter 103. The power converter 103 is connected between the line connection of the HV network and the RC network 1050. The capacitors 1052, 1055, 1058 are in parallel connection to high resistance drop off elements 1053, 1056, 1059. In this example the high resistance drop off elements 1053, 1056, 1059 are designed as resistors 1053, 1056, 1059, especially high value resistors 1053, 1056, 1059 having a high resistance. These the high value resistors 1053, 1056, 1059 are designed to allow a trapped charge in the capacitive components 1052, 1055, 1058, in this example capacitors 1052, 1055, 1058, to drop off the capacitive components 1052, 1055, 1058.

According to this example, a voltage sense module 107 is also provided and is connected between the line connection of the HV network and the power converter 103. The voltage sense module 107 is discussed in more detail below with reference to FIG. 7.

Therefore, the RC network 1050 is arranged for connection between the HV electrical power supply and the power converter 103. This arrangement may limit the current drawn from the HV electrical power supply in order to generate a low voltage electrical power supply for providing power to power switching systems.

The capacitors 1052, 1055, 1058 in the RC network 1050 limit the current at power frequency (PF) and ensure that the power dissipation in the resistors 1051, 1054, 1057 is low and the resistors 1051, 1054, 1057 are not stressed beyond their power and voltage ratings. The resistors 1051, 1054, 1057 limit the current during impulse conditions and withstand the impulse voltage so that the capacitors 1052, 1055, 1058 and the power converter 103 are not stressed beyond their ratings. The values of the RC network 1050 are arranged to provide the current and voltage required for the power converter 103. In this example the current drawn from the power line is limited to approximately 1.5 mA at nominal voltage. Although it is possible to draw significantly more current than this, the associated component costs may rise.

The power converter 103 has a rectifier 109 for rectifying the current. This rectified current is used to charge a capacitor C10 to a voltage of approximately 300V, which is limited by a Zener diode Z10. This arrangement provides 450 mW of available power (300V×1.5 mA) and is used to supply a switching DC-DC power converter module 111, which converts the 300V down to the required supply for the load electronics. A typical voltage supply for the load electronics would be around 6V.

Alternatively, a DC-AC switching power converter can be provided if there is a requirement to do so. Also, as a further alternative, rectifier 109 can be omitted and an AC-DC or AC-AC power converter provided. It will be understood that any other suitable voltage supply may be provided by the power converter module 111 depending on the requirements of the load electronics connected to the power converter 103.

Consideration of the physical implementation of the various components of the electrical power conversion system is important from a cost and reliability standpoint.

For example, the arrangement of multiple resistors and multiple capacitors to form an RC network 1050 in a chain spreads the electrical stress and allows design of a predictable and controlled electrical stress insulation system.

According to this embodiment, the resistors 1051, 1054, 1057 and capacitors 1052, 1055, 1058 are surface mount technology (SMT) components that are machine assembled on small printed circuit boards (PCBs), referred to as wafers. The same may be true for the high value resistors 1053, 1056, 1059.

The use of SMT components in this manner reduces cost and enables a pre-determined number of multiple wafers to be arranged with respect to each other in order to control electrical stresses.

After the wafers have been manufactured to create an arrangement of SMT resistors 1051, 1054, 1057, high value resistors 1053, 1056, 1059 and capacitors 1052, 1055, 1058 thereon, the wafers are assembled into a stack, wherein the high value resistors 1053, 1056, 1059 are connected in parallel to the capacitors 1052, 1055, 1058. The wafers are then interconnected in a zigzag fashion to form an RC network chain 1050. That is, a left-hand side of a first wafer is connected to the right-hand side of a second wafer, where the first and second wafers are at different levels in the stack. The arrangement of stacked wafers assists with the control of electrical stresses and also with keeping cost of assembly low. Other arrangements of RC chain 1050 on the wafer are possible and other arrangements for interconnection of wafers are possible.

According to an alternative, the SMT resistive 1051, 1054, 1057 and capacitive components 1052, 1055, 1058 may be mounted on a flexible printed circuit board in a zig-zag arrangement and the printed circuit boards may be rolled up into a tube. This provides a different form factor which may be more suitable to some applications.

The number of wafers in the stack may be adjusted to accommodate different line voltages of the HV network. For example, a single wafer may be used, or alternatively a stack of wafers including two or more wafers may be used. Therefore, a standard wafer component can be used to accommodate the various voltage and power requirements of different HV networks.

Figure 2A:
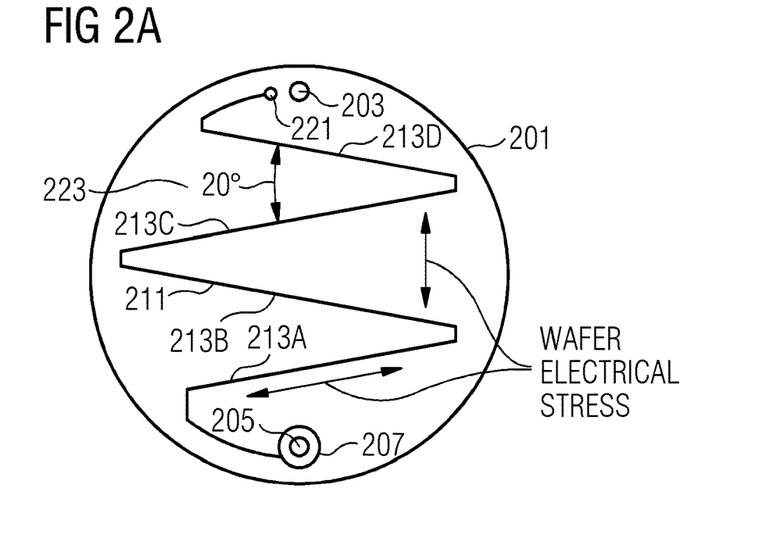
FIG. 2A shows a component side view of an electronic circuit board according to the present invention.
Figure 2B:
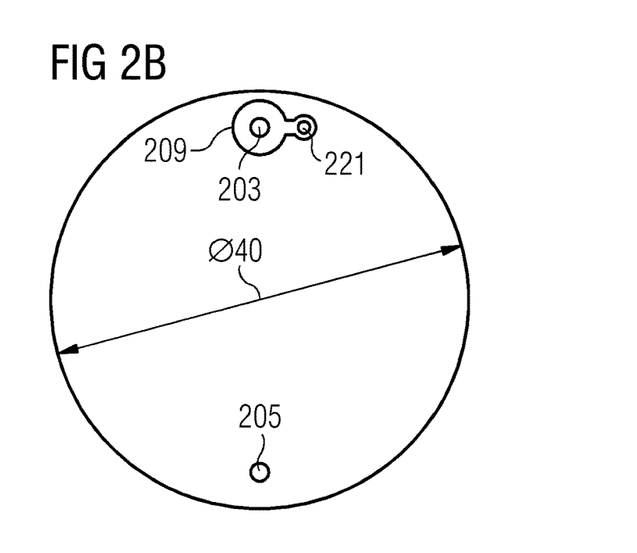
FIG. 2B shows a bottom view of an electronic circuit board according to the present invention.
Figure 2C:
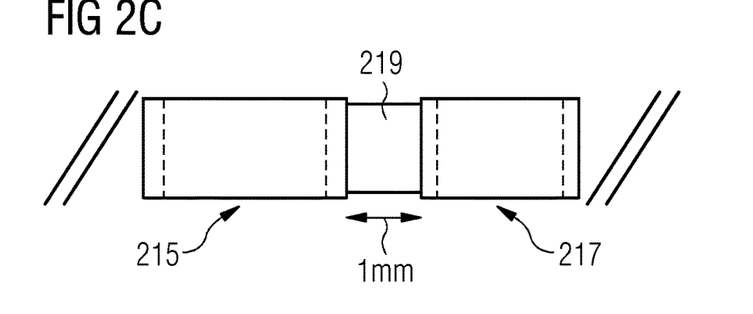
FIG. 2C shows a surface mount view of a resistor and capacitor pair according to the present invention.

With reference to the following figures, FIG. 2A shows a component side view of an electronic circuit board (wafer) 201. FIG. 2B shows a bottom side view of the electronic circuit board. FIG. 2C shows a surface mount view of a resistor 215 and capacitor 217 pair.

According to this embodiment, the wafer is approximately 40 mm in diameter. It will be understood that other suitable diameter wafers may be used as an alternative.

A first hole 203 is formed around the periphery of the wafer 201. The first hole passes from a first side of the wafer through to a second opposing side of the wafer. The first side of the wafer has an upper surface upon which the SMT components are mounted.

Figure 3A:
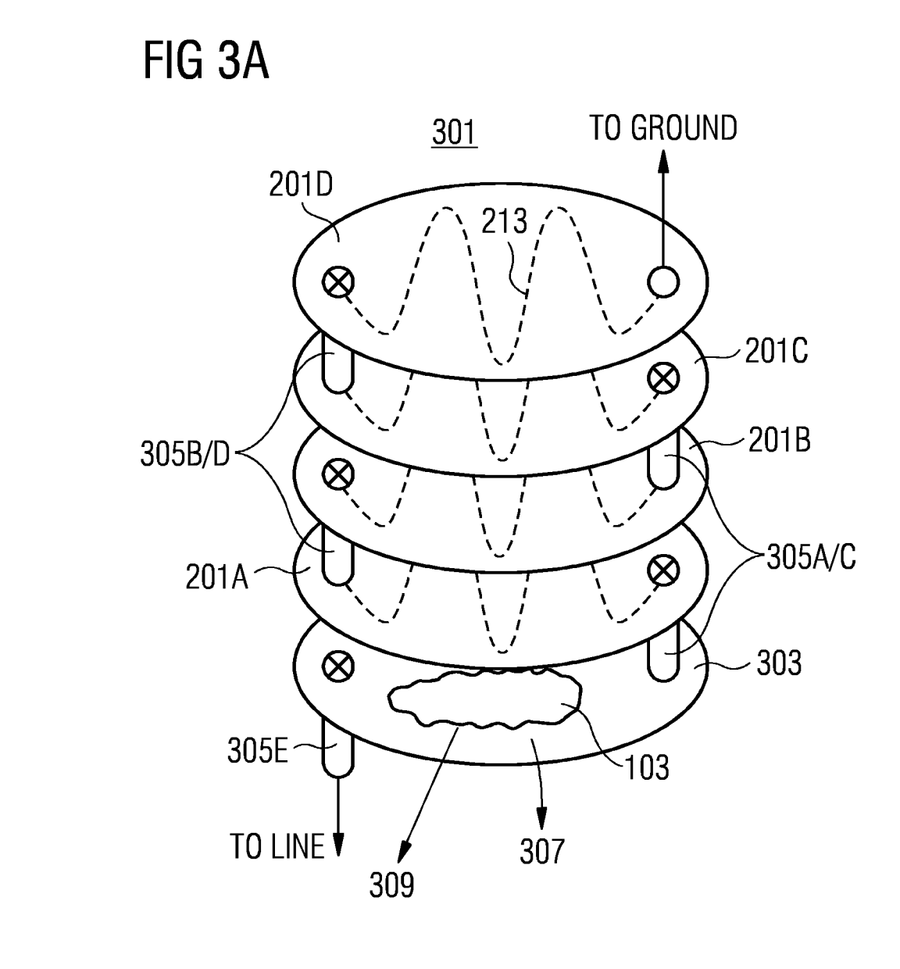
FIG. 3A is a perspective view of a stack of electrically interconnected electronic circuit boards according to the present invention.

A second diametrically opposing hole 205 is also formed around the periphery of the wafer 201. A first electrically conductive pad 207 is positioned on a first side of the wafer 201 around the second hole 205. The electrically conductive pad 207 is to provide a suitable electrical connection to an adjacent wafer in a stack of wafers, as explained in more detail with reference to FIG. 3 below.

A second electrically conductive pad 209 is positioned on a second side of the wafer 201 around the first hole 203 to provide an electrical connection to other wafers in the stack.

According to this embodiment, each of the first and second holes is 4.1 mm in diameter. It will be understood that other suitable diameter holes may be formed through the wafer as an alternative.

The RC network of surface mounted resistors 215 and capacitors 217 is arranged on the surface of the wafer 201 as indicated by the line 211 between the pad 209 and pad 207. According to this example, the RC network chain 1050 on each wafer is approximately 132 mm in length and has multiple individual straight sections 213A, 213B, 213C and 213D that are connected together and that traverse side to side across the wafer's upper surface to create an RC network 1050 with a suitable length and with controlled voltage stress between each traverse. That is, each section straight 213A, 213B, 213C and 213D is made up of multiple pairs of an SMT resistor 215 and SMT capacitor 217 connected together via an electrical pad 219 as shown in FIG. 2C. The resistor 215 and capacitor 217 are separated from each other by a distance of approximately 1 mm.

At the end of the RC network chain, a plated through hole (PTH) electrically connects the RC network to the second electrically conductive pad 209 located on the reverse side of the wafer.

It will be understood that different configurations of RC networks 1050 may be arranged on the surface of the wafer. For example, the RC network may traverse side to side across the wafer's upper surface to create an RC network with a length that is greater than two, three, four or five times the diameter of the upper surface. This will depend on the angle between each individual transverse straight section of the RC network.

The chosen chain angle 223 between each of the straight sections 213A, 213B, 213C and 213D of the RC network defines the electrical stress placed on the wafer. According to this example, the chain angle has been selected to be 20 degrees. It will be understood that, as an alternative, the chain angle may be between 15 degrees and 25 degrees. As a further alternative, the chain angle may be between 10 degrees and 30 degrees. As further alternatives, the chain angle may be greater than 20 degrees, greater than 25 degrees, greater than 30 degrees, greater than 35 degrees, greater than 40 degrees or greater than 45 degrees.

Therefore, the electrical power conversion system 101 as described herein has resistive components 1051, 1054, 1057 that are surface mounted resistive components 215 and capacitive components 1052, 1055, 1058 that are surface mounted capacitive components 217. The surface mounted resistive components 215 and the surface mounted capacitive components 217 are mounted on a single side of one or more electronic circuit boards (wafers) forming the RC network. Alternatively, the resistive and capacitive components may be mounted on both sides of the wafer.

The high resistance drop off elements high value resistors 1053, 1056, 1059 may be connected in parallel to the capacitors 1052, 1055, 1058. In a further not shown example the high resistance drop off elements are not dedicated resistors but are formed by a conductive coating having a high value resistance, which coats the capacitive components 1052, 1055, 1058 and acts as a high value resistor.

FIG. 3A shows a stack 301 of electrically interconnected electronic circuit boards or wafers 201A, 201B, 201C, 201D. Each of the wafers 201A, 201B, 201C, 201D is as described above with reference to FIG. 2A, FIG. 2B and FIG. 2C. An additional wafer 303 is provided which has the power converter 103 and a voltage sense module (if required) located thereon.

A single wafer interconnector 305A, 305B, 305C, 305D is provided between each wafer to provide an electrical connection between the wafers. On the additional wafer 303 a further wafer interconnector 305E connects the additional wafer to the line connection of the HV network. Therefore, the PTH of the additional wafer connects the line connection of the HV network to the voltage sense module (if required) and the power conversion system 101. The output of the power conversion system 101 (via the power converter 103) to the load electronics is provided by way of a further electrical connection 307. The output of the voltage sense module to the load electronics is provided by way of a second further electrical connection 309.

The upper wafer 201D of the stack of wafers is connected to the ground connection of the HV network.

Therefore, the electrical power conversion system 101 as described herein has surface mounted resistive components 215 and surface mounted capacitive components 217 that are mounted on a plurality of electronic circuit boards forming a plurality of RC networks. There is one RC network on each electronic circuit board. The electronic circuit boards are stacked and electrically interconnected forming a stacked RC network. Further, the power converter may be mounted on a further electronic circuit board, where the further electronic circuit board forms part of the plurality of electronic circuit boards that are stacked.

The stack of wafers may be assembled into an electrically insulated tube that has electrical terminals at opposing ends. The electrically insulated tube has suitable insulation properties for the desired electrical application. One such example of an electrically insulated tube could be the type of tube used to house an outdoor surge arrestor.

Figure 3B:
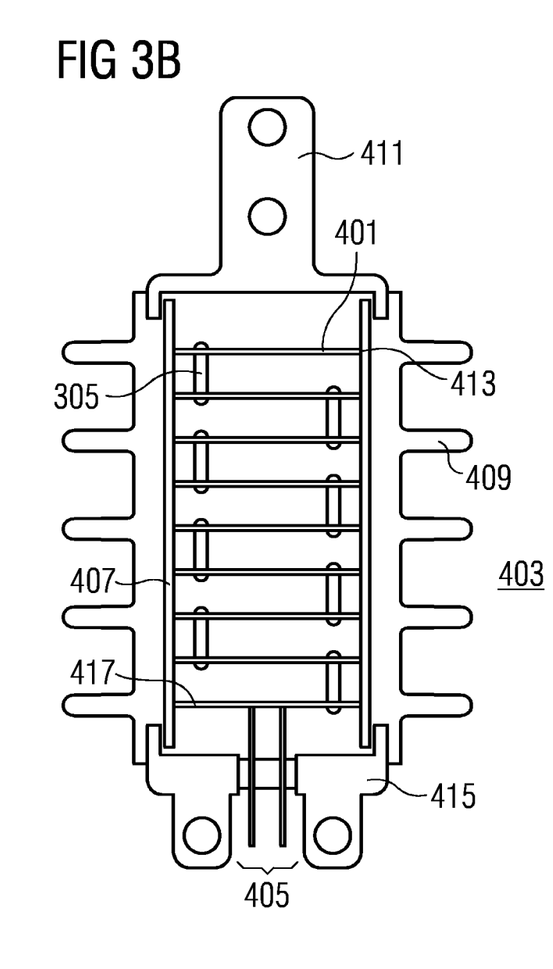
FIG. 3B is a cross sectional view of an RC network stack in a housing according to the present invention.

FIG. 3B shows a cross-sectional view of an RC network stack 401 in a housing 403. FIG. 3B shows how the stack may be assembled within a "surge arrestor" housing. At the bottom of the housing are connections 405 to taking the low voltage power supply and the voltage measurement signal to a Fusesaver® (a registered trademark of Siemens Aktiengesellschaft of Germany).

Fusesaver® is a new class of intelligent, compact and low cost single phase circuit breaker that minimizes lost customer minutes by protecting lateral line (spur line or T-off) fuses from blowing on transient faults. With on-board microprocessor control and wireless connectivity, Fusesaver® has configurable protection, multi-phase operation functions, on-board event history and can be integrated into a SCADA system for remote control.

The Siemens Fusesaver® product can be powered from the line current obtained from HV networks. However, it would be advantageous if the Fusesaver® were powered from line voltage. It will be understood that, although the principles described herein relate to the Fusesaver® product, the principles may be applicable generally to other types of products and applications.

The wafer stack 401 with wafers interconnected via interconnectors 305 is located within a cylindrical insulated housing tube 407. A silicone overmolding 409 is fabricated and positioned so that it is located around the outer surface of the housing tube 407.

A first conductive end cap 411 is positioned at a first end of the housing tube 407 and connects the upper wafer 413 of the wafer stack to the ground line of the HV network. That is, the first conductive end cap 411 provides an electrical connection between one end of the RC network located on the upper wafer 413 and the ground line.

A second conductive end cap 415 is positioned at a second end of the housing tube 407 and connects the lower wafer 417 of the wafer stack to the Fusesaver® body. That is, the second conductive end cap 415 provides an electrical connection between the power converter (with or without the voltage sense module) located on the lower wafer 417 and the Fusesaver® body, where the Fusesaver® body is in direct connection with the line connection of the HV network (see FIG. 4).

Figure 4:
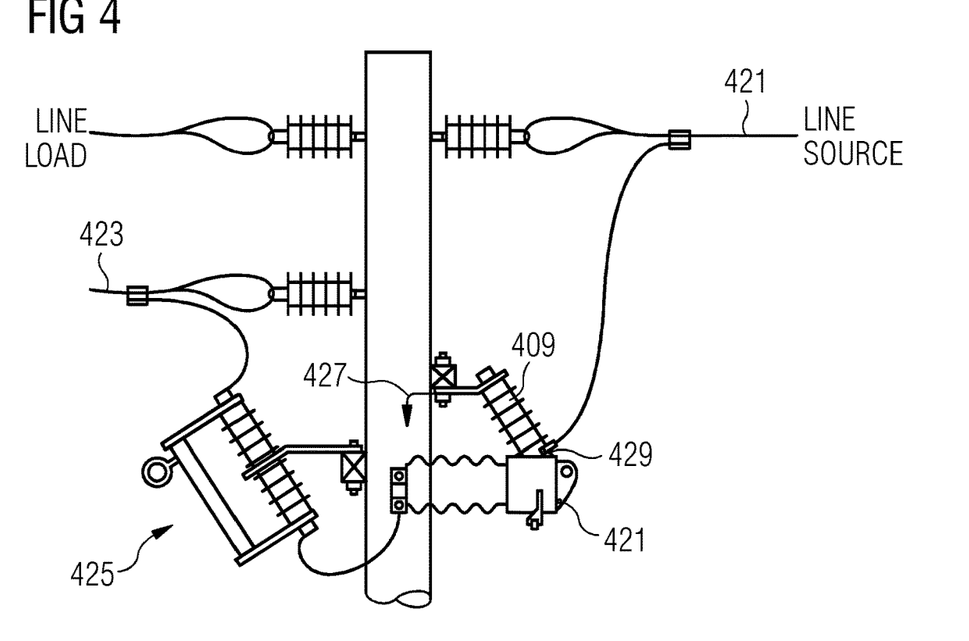
FIG. 4 is a view of the device in FIG. 2B connected to a fuse saver device according to the present invention.

FIG. 4 shows a view of the device described above with reference to FIG. 3B connected to the body of a Fusesaver® device.

FIG. 4 shows how the electrical power conversion system constructed as above in the form of a stacked RC network in an insulated tube could be mounted onto a Siemens Fusesaver® product 421, which is installed on an electrical spur line 423 with a fuse 425. The upper end of the electrical power conversion system (i.e. the RC network) is connected to ground 427 of the HV network. The lower end of the electrical power conversion system (i.e. the power converter) is connected to the Fusesaver® body 429 which is at line potential as it is connected to the main line source 421 of the HV network. The power supply output from the switched mode DC-DC power converter and the voltage measurement signal from the voltage sense module are not visible as they are connected internally within the Fusesaver® product.

It will be understood that many other suitable configurations are possible besides that shown in FIG. 4.

It will be understood that the power conversion system may include one or more RC networks 1050 and one or more power converters 103, where the power converters 103 and RC networks 1050 are connected in series across a line potential of the HV power supply.

According to a first example, a power conversion system 101 may have a single RC network 1050 and a single power converter 103 connected in series, where the RC network 1050 is connected to the ground connection of a single phase HV network and the power converter 103 is connected to the line connection of the single phase HV network.

Alternatively, the HV network may be a polyphase network.

Alternatively, the HV network may be a polyphase network where the RC network 1050 is connected to the ground connection and phase converter is connected to one of the line connections.

According to a second example, a power conversion system may have a single RC network and a single power converter connected in series, where the RC network is connected to the line connection of a single phase HV network and the power converter is connected to the ground connection of the single phase HV network.

Alternatively, the HV network may be a polyphase network where the RC network is connected to one of the line connections and phase converter is connected to the ground connection.

According to a third example, a power conversion system may have a single RC network and a single power converter connected in series, where the RC network is connected to a first line connection of a polyphase HV network and the power converter is connected to a second line connection of the polyphase HV network. That is, the RC network and phase converter are connected between two different phases of the HV network.

According to a fourth example, a power conversion system may have a single RC network and a first and second power converter connected in series either side of the RC network, where the first power converter is connected to a first line connection of a polyphase HV network and the second power converter is connected to a second line connection of the polyphase HV network. That is, the RC network and two phase converters are connected between two different phases of the HV network.

According to a fifth example, a power conversion system may have a single RC network and a first and second power converter connected in series either side of the RC network, where the first power converter is connected to a line connection of a single phase HV network and the second power converter is connected to a ground connection of the polyphase HV network.

Figure 5:
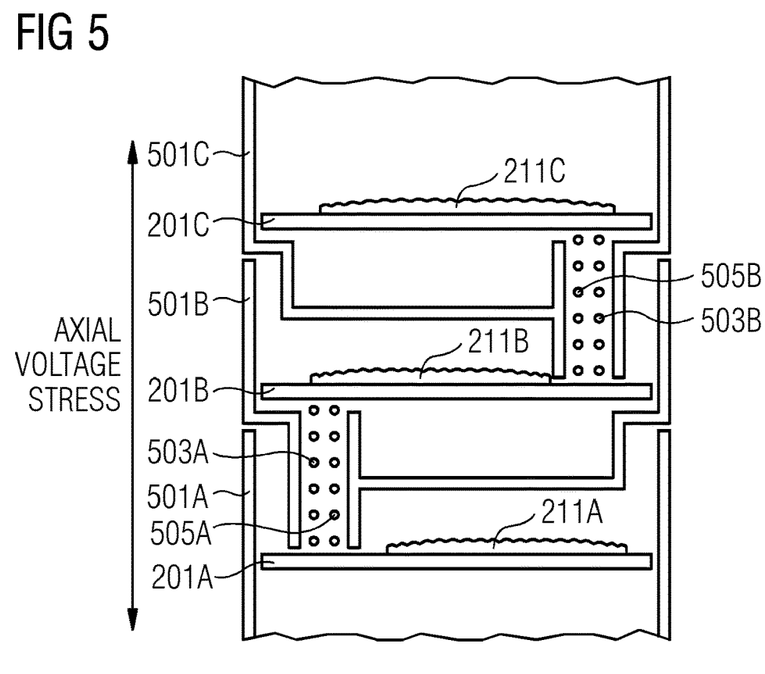
FIG. 5 shows a stack of electrically interconnected electronic circuit boards within insulating cups according to the present invention.

FIG. 5 shows a stack of electrically interconnected electronic circuit boards, wafers, within insulating cups 501A, 501B, 501C. The insulating cups 501A, 501B, 501C support the wafers 201A, 201B, 201C with the RC chain networks 211A, 211B, 211C located thereon. Electrically conductive connecting springs 503A, 503B electrically connect the wafers together and provide some flexibility to ease axial voltage stress. That is, the insulating cups 501A, 501B, 501C have a channel 505A, 505B formed therein to receive the springs 503A, 503B where the channel extends between a lower surface of a first wafer to the upper surface of a second wafer. The insulating cups 501A, 501B, 501C may be shaped to control the axial and transverse voltage stress associated with the wafer stack. Therefore, the electrical power conversion system as described herein has one or more insulated circuit board receptacles that are arranged to support the one or more electronic circuit boards, wafers. Each of the insulated circuit board receptacles may be arranged to support one of a number of the electrically interconnected electronic circuit boards in a stacked configuration.

Figure 6:
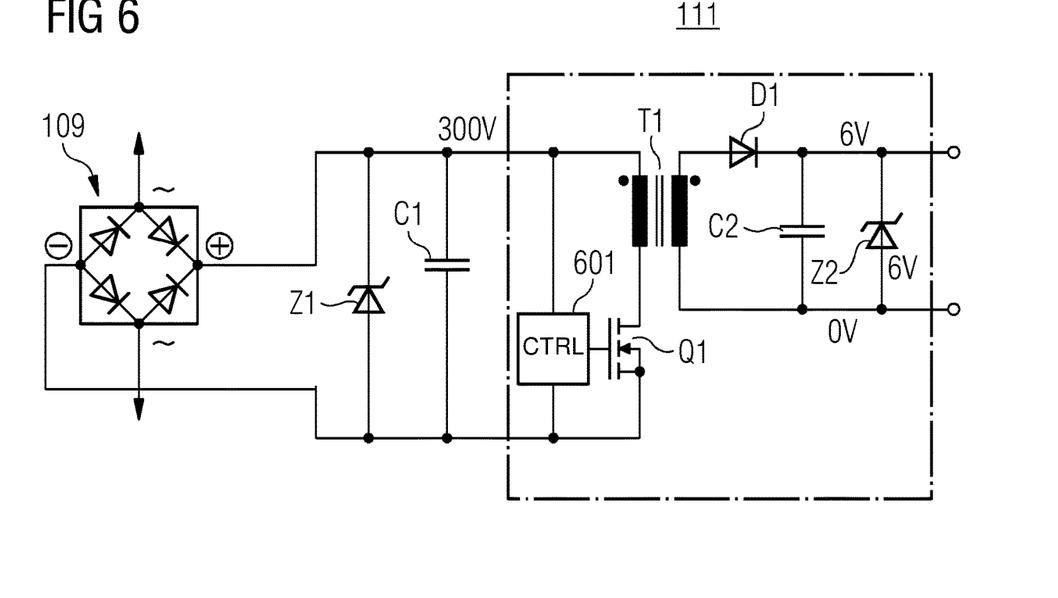
FIG. 6 shows a schematic diagram of a power converter according to the present invention.

FIG. 6 shows a schematic diagram of a power converter 103 including a switching DC-DC power converter 111 (switched mode power supply). A control circuit 601 provides high frequency switching control of switching transistor Q1, which feeds power to the primary winding of a forward step-down transformer T1. The output of the secondary winding of T1 is rectified by diode D1 and feeds a reservoir capacitor C2. The Zener diode Z2 limits the output voltage to 6V. The output power generated by the switched mode power supply (SMPS) is provided to the load electronic system.

As can be seen the SMPS is operated with a high voltage in the order of 300V on the primary side and in conjunction with the RC chain solution as described herein. The SMPS converts from approximately 300V to the output voltage required by the load electronics.

Figure 7:
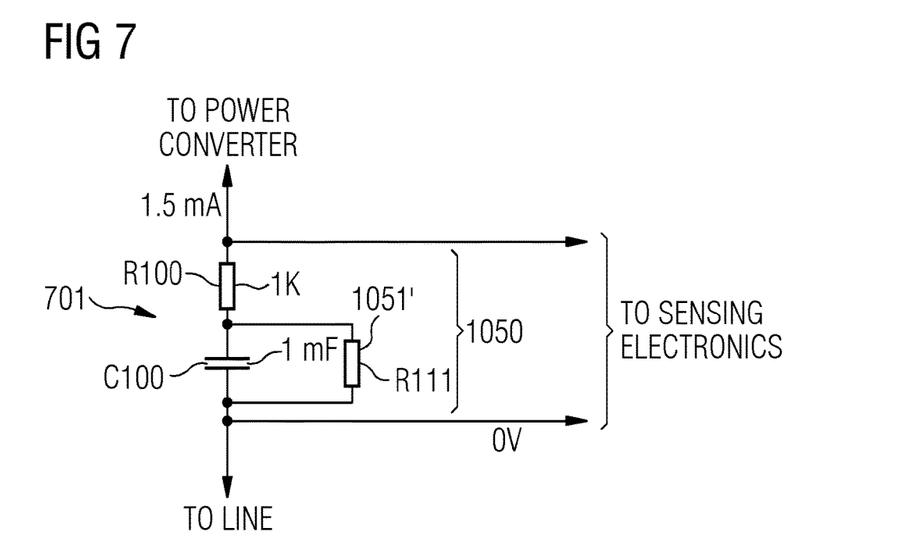
FIG. 7 shows a schematic diagram of a voltage sensor according to the present invention.

FIG. 7 shows a schematic diagram of a voltage sense module 701. The current flowing through the RC chain network 1050 is substantially proportional to the phase-ground voltage of the HV network. This can be converted electronically into a suitable sense signal for the Fusesaver® electronics by the line voltage sense module shown in FIG. 7. This therefore provides a system for monitoring the status of the phase-ground voltage.

In this circuit the RC chain current is converted to voltage by a resistor R100 in series with a capacitor C100. By selecting correct values for R100 and C100, the phase shift introduced by the RC chain network is corrected so that the voltage output of the voltage sense module is in phase with the line voltage signal of the HV network.

To avoid trapped charges in the capacitive components to build up, resistor R111 1050' allows a trapped charge in the capacitive component c100 to drop off the capacitive component C100.

It will be understood that there are many other possible implementations to correct for the phase shift caused by the RC chain network including, for example, signal processing to derive the corrected signal.

Therefore, the electrical power conversion system has a voltage sense module that is adapted to measure a current flowing through the RC network and convert that current to a sensor voltage value for use by sensing electronics. Further, the voltage sense module is arranged to correct the phase shift caused by the RC network.

In order to overcome the inherent inaccuracy of the described method of voltage sensor measurement provided by the voltage sense module due to the power converter subtracting 300V from line voltage driving the current in the RC chain, a voltage loss correction module may be incorporated into the downstream electronics which is processing the signal from the voltage sense module to correct the sensor voltage value based on voltage losses caused by the power conversion system.

Without the voltage loss correction module, if the peak line voltage is below 300V no current will flow in the line voltage sense resistor. Also, at line voltages above 300V peak, the 300V would be subtracted from the instantaneous value measured by the voltage sense module.

To correct for the inaccuracy at voltages above the 300V threshold due to the power conversion system, 300V can be digitally added by the voltage loss correction module to each of the samples. For 1 ms sampling of a 6.3 kV signal this method reduces the measurement error from 4.5% to 0.02%. It will be understood that other methods of error correction are envisaged.

Control of electrical stress is critical to the long term reliability of insulating products. The herein described systems enable electrical stress to be predicted and well controlled as well as being relatively independent of manufacturing variations.

Electrical stresses on the resistive and capacitive components may be calculated under the various PF conditions to be withstood (such as phase/ground voltage, PF test) using commonplace electronic design practices. These values may be used to determine the number of components required to meet the component manufacturers rating, tolerance aspects etc. Transverse electrical stress between elements of the RC network chain is controlled by the component layout (i.e. the configuration of the RC network) on the wafer PCB. The design requirement is to meet the appropriate surface electrical stress for the product environment and the PCB material. The determination of the appropriate stress and configuration results in the chain angle as shown in FIG. 2A.

Wafer axial stress is dependent on the voltage developed across each wafer and the wafer spacing. Finite element analysis can be used to calculate stresses and stress can be further controlled by use of a conformal coating (to reduce triple point stress), and interposing insulating elements. In this example, stacking cups may be used to assemble the wafer stack and to provide additional insulation as shown in FIG. 5.

Various advantages are provided for certain features as described herein as follows:

Use of an RC network 1050 to provide a power source from a power line of an HV network:
  This provides an advantage that current is limited at both PF and impulse conditions with the advantage of low power dissipation at normal voltages.
  Further, power can be supplied to either a grounded device, to a device floating at line potential or to both.
Use of SMPS to convert current to useable power with high frequency switching:
  This provides an advantage in that the cost and size of making a PF transformer is negated. Using a SMPS enables high efficiency, low cost, and small size conversion of the power from the RC network.
Use of multiple SMT components on circuit boards to make the RC network:
  This provides various advantages including, for example, the minimization of costs, control of electrical stresses and the provision of graceful degradation for component failure.
Use of stacked wafer construction:
  This provides various advantages including, for example, controlling electrical stresses and allowing various rated voltages to be achieved using multiple sets of the same basic component parts.
Use of stacking cups:
  This provides various advantages including, for example, controlling electrical stresses and minimizing costs.
Addition of voltage sensing network to provide voltage sensing from the current provided by the RC chain:
  This provides various advantages including, for example, enabling line voltage measurement.
Digital correction of distortion of voltage sensing due to power take off:
  This provides various advantages including, for example, improving accuracy from RC chain.

Although the example shown in FIG. 1 shows the RC network 1050 connected to the ground connection of the HV network, and the power converter 103 connected to the line connection of the HV network (via the optional voltage sense module), as mentioned above it will be understood that, as an alternative, the RC network 1050 may be connected to the line connection of the HV network and the power converter 103 may be connected to the ground connection of the HV network.

As a further alternative, as mentioned above, the RC network 1050 may be connected to a first line connection (i.e. a first phase of the three-phase HV network) and the power converter 103 may be connected to a second line connection (i.e. a second phase of the three-phase HV network.

It will be understood that, according to further alternatives, the power converter of the power conversion system 101 may be located at
  i) the grounded end of the HV network to supply a grounded electronic system,
  ii) at the line end of the HV network to supply an electronic system floating at line potential, or
  iii) where there are multiple power converters, at both ends.

It will be understood that, according to a further alternative, the power converter module may be an AC-DC power converter module and that the power converter 103 does not require the rectifier 109, capacitor C10 and the Zener diode Z10.

As a further alternative, it will be understood that the power converter may be placed on a wafer in order to create a self-contained electrical power conversion system 101 which may then be connected directly to the HV network.

Further, the voltage sense module may be located on the power converter wafer to condition the current flowing in the RC network chain into a signal for the load electronics to measure the line-ground voltage, as discussed in more detail herein.

According to the above described example, there are an equal number of resistors and capacitors in the series RC chain. However, it will be understood that, as an alternative, there may be more resistors than capacitors, or more capacitors than resistors.

It will be understood that, as an alternative, there may be more than one series RC network 1050. For example, multiple series RC networks may be connected between HV electrical power supply and the power converter either in series or in parallel, e.g. to provide a level of redundancy.

It will be understood that, as an alternative, there are many integrated circuits that are available to perform the function of the SMPS.

Further, it would be understood that there are many possible circuit topologies such as, for example, forward or fly back, isolated or non-isolated etc.

With regard to the following claims, the indefinite article "a" or "an" denotes both singular and plural forms. That is, a claim calling for "a power converter" should be understood to mean "at least one power converter" or, similarly, "one or more power converters." A claim calling for "an RC network" should be understood to call for "at least one RC network" or for "one or more RC networks."

The invention claimed is:

1. An electrical power conversion system for converting a high voltage (HV) from an HV electrical power supply to a low voltage, the electrical power conversion system comprising:
   a power converter; and
   an RC network connected in series said power converter;
   said RC network including a plurality of resistive components and a plurality of capacitive components electrically connected in series; and
   said RC network further including high resistance drop off elements connected in parallel with said capacitive components;
   wherein said RC network and said power converter are connected across a line potential of the HV electrical power supply; and
   wherein the line potential of the HV electrical power supply is between 1 kV and 52.5 kV.

2. The electrical power conversion system according to claim 1, wherein said high resistance drop off elements are high value resistors.

3. The electrical power conversion system according to claim 2, wherein said high value resistors are configured to allow a trapped charge in said capacitive components to drop off said capacitive components.

4. The electrical power conversion system according to claim 1, wherein said high resistance drop off elements are formed by a conductive coating on a printed circuit board holding said capacitive components.

5. The electrical power conversion system according to claim 1, wherein said power converter comprises a switched mode power supply.

6. The electrical power conversion system according to claim 1, wherein:
   said resistive components are surface mounted resistive components and said capacitive components are surface mounted capacitive components, and
   said surface mounted resistive components and said surface mounted capacitive components are mounted on one or more electronic circuit boards forming said RC network on said one or more electronic circuit boards.

7. The electrical power conversion system according to claim 6, wherein:
   said surface mounted resistive components and said surface mounted capacitive components are mounted on a plurality of electronic circuit boards forming a plurality of said RC networks, wherein each one of said plurality of electronic circuit boards includes one of said plurality of said RC networks; and
   said plurality of electronic circuit boards are stacked and electrically interconnected forming a stacked RC network.

8. The electrical power conversion system according to claim 7, wherein said power converter is mounted on a further electronic circuit board, and said further electronic circuit board forms part of said plurality of stacked electronic circuit boards.

9. The electrical power conversion system according to claim 6, further comprising one or more insulated circuit board receptacles arranged to support said one or more electronic circuit boards.

10. The electrical power conversion system according to claim 6, further comprising a plurality of insulated circuit board receptacles, each arranged to support one of a plurality of said electrically interconnected electronic circuit boards in a stacked configuration.

11. The electrical power conversion system according to claim 1, further comprising a voltage sense module configured to measure a current flowing through said RC network and to convert the current to a sensor voltage value.

12. The electrical power conversion system according to claim 11, further comprising a voltage loss correction module configured to correct the sensor voltage value based on voltage losses caused by said power converter.

13. The electrical power conversion system according to claim 1, wherein said RC network and said power converter are arranged to be connected between a line connection of the HV electrical power supply and a ground connection of the HV electrical supply.

14. The electrical power conversion system according to claim 1, wherein said RC network and said power converter are arranged to be connected between a first line connection of the HV electrical power supply and a second line connection of the HV electrical supply.

* * * * *